United States Patent
Kijima et al.

(10) Patent No.: US 7,026,169 B2
(45) Date of Patent: Apr. 11, 2006

(54) METHOD OF FORMING PZT FERROELECTRIC FILM

(75) Inventors: Takeshi Kijima, Matsumoto (JP); Yasuaki Hamada, Suwa (JP); Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 54 days.

(21) Appl. No.: 10/800,722

(22) Filed: Mar. 16, 2004

(65) Prior Publication Data

US 2004/0259275 A1    Dec. 23, 2004

(30) Foreign Application Priority Data

Mar. 17, 2003    (JP) .............................. 2003-071953

(51) Int. Cl.
*H01L 21/00*    (2006.01)

(52) U.S. Cl. .......................... 438/3; 438/681

(58) Field of Classification Search ............. 427/419.3, 427/324, 255.7, 255.28, 248.1, 126.3, 79, 427/81; 438/3, 680, 681
See application file for complete search history.

(56) References Cited

U.S. PATENT DOCUMENTS 5,714,194 A * 2/1998 Komai et al. ................. 427/81
2003/0175425 A1 * 9/2003 Tatsumi ................. 427/255.28

* cited by examiner

*Primary Examiner*—Asok Kumar Sarkar
(74) *Attorney, Agent, or Firm*—Oliff & Berridge PLC

(57) ABSTRACT

A method of forming a ferroelectric film including a complex oxide of PZT family on a metal film formed of Pt by using a metalorganic chemical vapor deposition method. At first, supply of Pb is started to form an alloy film of Pb and Pt on the metal film. Supply of Ti is then started to form an initial crystal nuclei of $PbTiO_3$ on the alloy film. Then, supply of Zr is started to form a crystal grown layer of the complex oxide of PZT family on the initial crystal nuclei.

6 Claims, 6 Drawing Sheets

METHOD OF FORMING PZT FERROELECTRIC FILM

Japanese Patent Application No. 2003-71953, filed on Mar. 17, 2003, is hereby incorporated by reference in its entirety.

BACKGROUND OF THE INVENTION

The present invention relates to a method of forming a ferroelectric film using a metalorganic chemical vapor deposition method.

In recent years, as a technology of forming a ferroelectric film which is expected to be applied to a ferroelectric memory and a piezoelectric device, a deposition technology using a metalorganic chemical vapor deposition (MOCVD) method used in the crystal growth technology of compound semiconductors has attracted attention in order to improve mass production capability.

However, in the case of depositing a complex oxide of lead zirconate titanete (PZT) family on a Pt metal film used as an electrode material, since the crystal lattice matching between the complex oxide of PZT family and the Pt metal film is poor, it is difficult to obtain a ferroelectric film having an excellent crystallization state by using a conventional deposition technology using the MOCVD method. In the case of depositing a complex oxide of PZT family by using the MOCVD method, the complex oxide of PZT family is generally deposited by supplying material gases for all the constituent elements at the same time. In the case of depositing a complex oxide of PZT family on a Pt metal film, a technology of forming a $TiO_x$ film between the Pt metal film and the PZT complex oxide crystal as a buffer layer by supplying only a Ti material and an oxidizing gas has been proposed in order to reduce the above-described lattice mismatch. However, since the orientation of the crystal of the $TiO_x$ film may adversely affect the orientation of the PZT complex oxide crystal, a technology which can replace this technology has been demanded.

BRIEF SUMMARY OF THE INVENTION

The present invention may provide a method of forming a ferroelectric film capable of providing a ferroelectric film including a PZT complex oxide with excellent crystal quality on a Pt metal film.

According to one aspect of the present invention, there is provided a method of forming a ferroelectric film including a complex oxide of lead zirconate titanate (PZT) family on a metal film formed of platinum (Pt) by using a metalorganic chemical vapor deposition method, the method comprising:

starting supply of lead (Pb) to form an alloy film of Pb and Pt on the metal film;

starting supply of titanium (Ti) to form initial crystal nuclei of a lead titanate ($PbTiO_3$) on the alloy film; and starting supply of zirconium (Zr) to form a crystal grown layer of the complex oxide of PZT family on the initial crystal nuclei.

DETAILED DESCRIPTION OF THE EMBODIMENT

Figure 1:
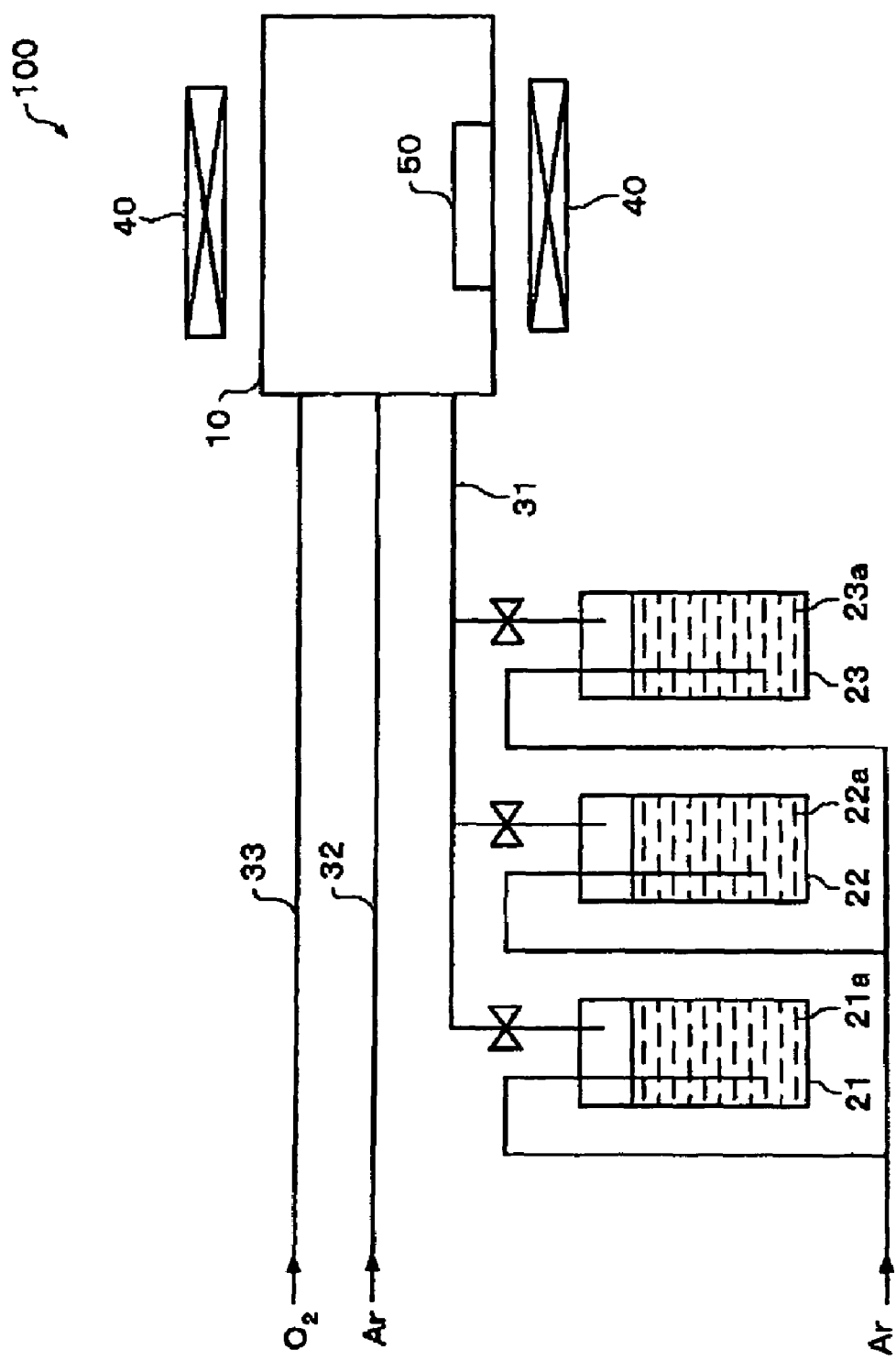
FIG. 1 is a diagram schematically showing an MOCVD device used in one embodiment of the present invention.

According to one embodiment of the present invention, there is provided a method of forming a ferroelectric film including a complex oxide of lead zirconate titanate (PZT) family on a metal film formed of platinum (Pt) by using a metalorganic chemical vapor deposition method, the method comprising:

starting supply of lead (Pb) to form an alloy film of Pb and Pt on the metal film;

starting supply of titanium (Ti) to form initial crystal nuclei of a lead titanate ($PbTiO_3$) on the alloy film; and starting supply of zirconium (Zr) to form a crystal grown layer of the complex oxide of PZT family on the initial crystal nuclei.

According to this method, an alloy film of Pb and Pt is formed on a metal film including Pt by using Pb which is one of elements of a complex oxide of PZT family. Since the alloy film has a lattice constant which easily allows lattice matching with a Pt film and PZT complex oxide, a strain of PZT complex oxide crystal formed on the alloy film caused by lattice mismatch can be reduced, whereby the interfacial state, which is one of the factors determining the fatigue characteristics of a ferroelectric film, can be improved. After forming the alloy film, the initial crystal nuclei of the $PbTiO_3$ complex oxide are formed on the alloy film by supplying Ti. It is known that the crystallization temperature of a PZT complex oxide becomes higher as the composition ratio of Zr is increased. Therefore, crystal with excellent quality can be obtained in a comparatively low temperature using $PbTiO_3$ which does not include Zr. In the method of forming a ferroelectric film according to this embodiment, the crystallization temperature of a PZT complex oxide can be reduced by reducing crystallization energy by utilizing the initial crystal nuclei of $PbTiO_3$ when forming the PZT complex oxide. Therefore, a ferroelectric film including a PZT complex oxide crystal having an excellent interfacial state with the Pt film and excellent quality can be obtained at a low crystallization temperature.

This method of forming a ferroelectric film may have the following features.

(A) The alloy film may be formed in an inert gas atmosphere; and supply of an oxidizing gas may be started together with the supply of Ti. This makes it possible to effectively reduce oxidation of Pb, which easily bonds to oxygen and scatters into the atmosphere, in the step of forming the alloy film.

(B) The alloy film may be formed at 400° C. or less. This makes it possible to effectively reduce scattering of Pb which easily vaporizes in a comparatively low temperature into the atmosphere in the step of forming the alloy film.

(C) The initial crystal nuclei may be formed in an island pattern. $PbTiO_3$ has a mechanical strength lower than that of the PZT complex oxide. The crystal grown layer of the PZT complex oxide is formed to cover the initial crystal nuclei by dispersing the initial crystal nuclei in an island pattern, so that the reliability of the ferroelectric film in mechanical strength can be improved.

Embodiment of the present invention is described below in more detail with reference to the drawings.

1. Forming Device

FIG. 1 is a view schematically showing a metalorganic chemical vapor deposition (MOCVD) device used for a method of forming a ferroelectric film according to the present embodiment.

An MOCVD device 100 includes a reaction chamber 10 and first to third material chambers 21, 22, and 23. Heaters 40 for controlling the temperature of a substrate 50 inside the reaction chamber 10 are provided around the reaction chamber 10. The first to third material chambers 21, 22, and 23 are connected with the reaction chamber 10 through a material supply line 31. The MOCVD device 100 is formed so that the flow rate of gas supplied to the reaction chamber 10 can be controlled by supplying argon (Ar) gas as a carrier gas to the reaction chamber 10 through a first gas supply line 32. An inert gas may be used as the carrier gas. Nitrogen ($N_2$) gas and the like can be given as examples of the carrier gas in addition to the argon gas. The MOCVD device 100 is formed so that oxygen ($O_2$) gas as an oxidizing gas for forming a complex oxide of PZT family can be supplied to the reaction chamber 10 through a second gas supply line 33. $N_2O$ gas or the like may be used as the oxidizing gas in addition to oxygen gas.

The material chamber 21 is charged with a lead (Pb) material 21a. As examples of the Pb material 21a, an alkyl-lead compound such as $Pb(C_2H_5)_4$, β-diketone-lead complex, and the like can be given.

The material chamber 22 is charged with a zirconium (Zr) material 22a. As examples of the Zr material 22a, an alkoxide such as $Zr(t-C_4H_9O)_4$ and the like can be given.

The material chamber 23 is charged with a titanium (Ti) material 23a. As examples of the Ti material 23a, $TiCl_4$, an alkoxide such as $Ti(i-C_3H_7O)_4$, and the like can be given.

2. PZT Ferroelectric Film

FIGS. 2A to 2D are cross-sectional views schematically showing steps of forming a ferroelectric film of PZT family according to the present embodiment.

Figure 2A:
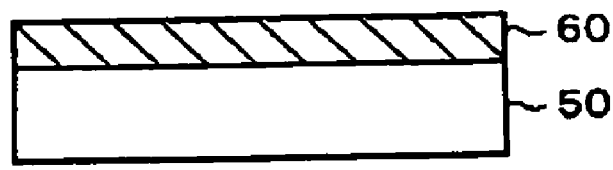
FIGS. 2A to 2D are cross-sectional views showing steps of forming a ferroelectric film according to one embodiment of the present invention.

In this method, a given substrate 50 on which a Pt metal film 60 is formed by sputtering or the like is provided as shown in FIG. 2A, and placed in the reaction chamber 10 of the MOCVD device 100 shown in FIG. 1. As the substrate 50, a substrate such as a semiconductor substrate or a resin substrate may optionally be employed without specific limitations depending on the application of the ferroelectric film.

Figure 2B:
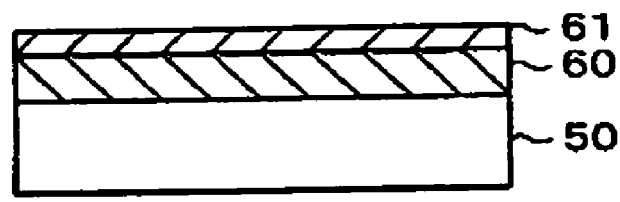
Figure 3:
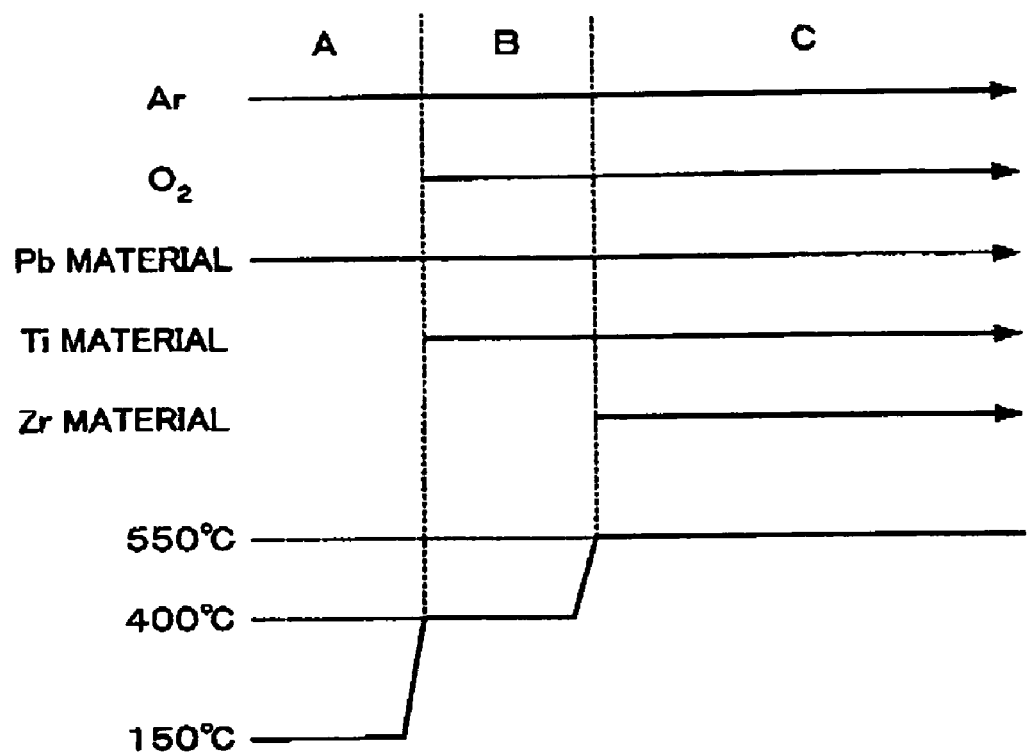
FIG. 3 is a diagram illustrative of material supply timing and temperature raising history in an MOCVD device.

In the MOCVD device 100, the Pb material 21a is supplied to the reaction chamber 10 together with Ar gas as the carrier gas, as shown in a section A in FIG. 3, to form a $PbPt_3$ alloy film 61, which is the alloy of Pt and Pb, on the Pt metal film 60, as shown in FIG. 2B. The atmosphere inside the reaction chamber 10 is preferably an inert gas atmosphere containing no $O_2$ gas as the oxidizing gas. The reason therefor is as follows. Since Pb easily bonds to oxygen, if the oxygen partial pressure in the atmosphere is high, Pb deposited on the Pt metal film 60 bonds to oxygen and scatters into the atmosphere. Specifically, in this method, Pb which makes up the alloy film 61 can be prevented from being released to the atmosphere by performing the step of forming the alloy film 61 in a non-oxidizing atmosphere formed by an inert gas such as Ar gas or $N_2$ gas. In this method, the heaters 40 are controlled so that the temperature of the substrate 50 is preferably 400° C. or less, and still more preferably about 150° C. Since Pb easily vaporizes in a comparatively low temperature region, it is also important to prevent Pb from scattering in the step of forming the alloy film 61 from the viewpoint of temperature.

Figure 2C:
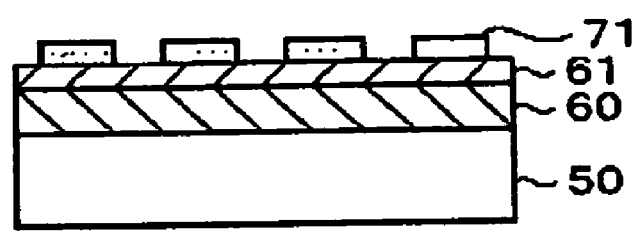

As shown in a section B in FIG. 3, the Ti material 22a and $O_2$ gas as the oxidizing gas are supplied to form initial crystal nuclei 71 of a $PbTiO_3$ complex oxide on the alloy film 61, as shown in FIG. 2C. The initial crystal nuclei 71 are preferably formed on the alloy film 61 in an island pattern. $PbTiO_3$ can reduce the crystallization temperature of the PZT complex oxide. However, $PbTiO_3$ has a mechanical strength lower than that of the PZT complex oxide. In this method, since a crystal grown layer 72 of the PZT complex oxide is formed to cover the initial crystal nuclei 71 by dispersing the initial crystal nuclei 71 in an island pattern, reliability of the ferroelectric film can be improved from the viewpoint of mechanical strength.

Figure 2D:
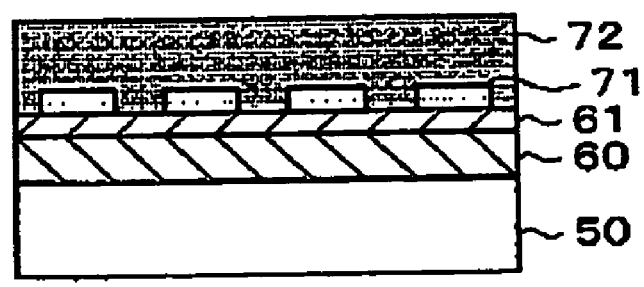

The Zr material 23a is supplied as shown in a section C in FIG. 3 to form the crystal grown layer 72 of a Pb$(Zr,Ti)O_3$ complex oxide on the initial crystal nuclei 71 as shown in FIG. 2D, whereby a PZT ferroelectric film can be obtained.

As described above, according to the method of forming a ferroelectric film of the present embodiment, since the alloy film 61 has a lattice constant which easily allows lattice matching with the Pt metal film 60 and the PZT complex oxide, a strain of the PZT complex oxide crystal formed on the alloy film 61 caused by lattice mismatch can be reduced, whereby the interfacial state, which is one of the factors that determine the fatigue characteristics of the ferroelectric film, can be improved. In the method of forming a ferroelectric film of the present embodiment, since the crystallization energy can be reduced by utilizing the initial crystal nuclei 71 of $PbTiO_3$ when forming the crystal grown layer 72 of the PZT complex oxide, the crystallization temperature of the PZT complex oxide can be reduced. Therefore, a ferroelectric film including the crystal grown layer 72 of the PZT complex oxide having an excellent interfacial state and excellent crystal quality can be formed on the Pt metal film 60 at a low crystallization temperature by using this method of the present embodiment.

Figure 4:
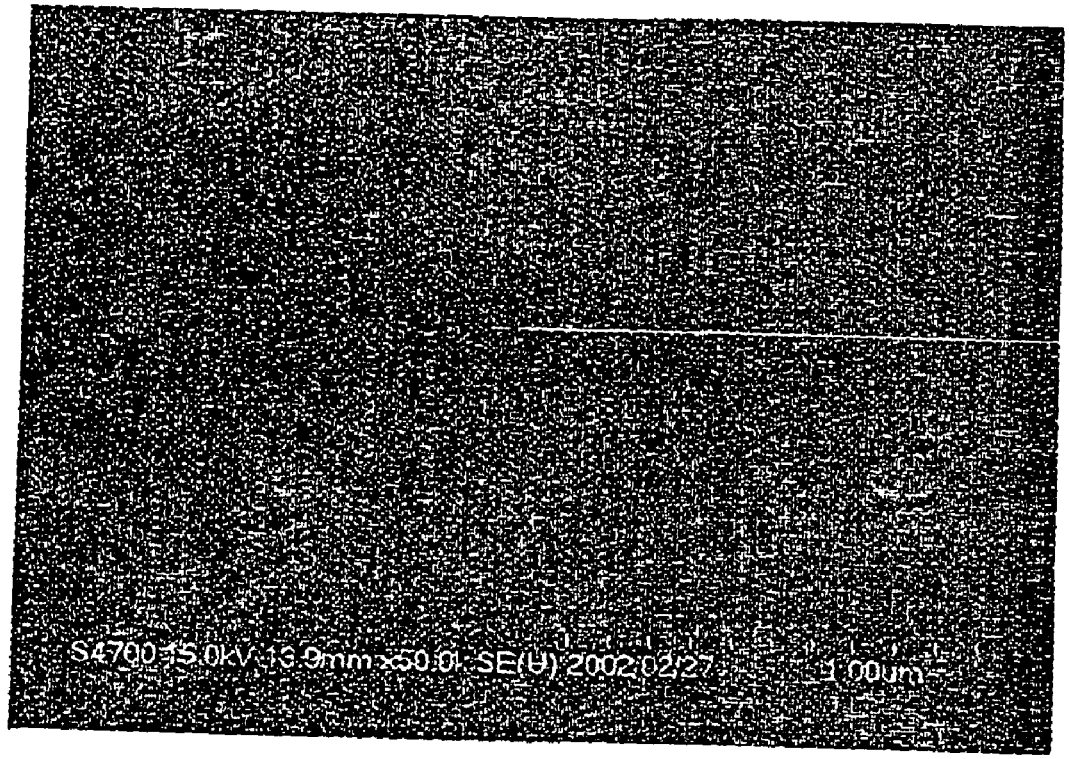
FIG. 4 shows observation results for surface morphology of a ferroelectric film according to one embodiment of the present invention.
Figure 5:
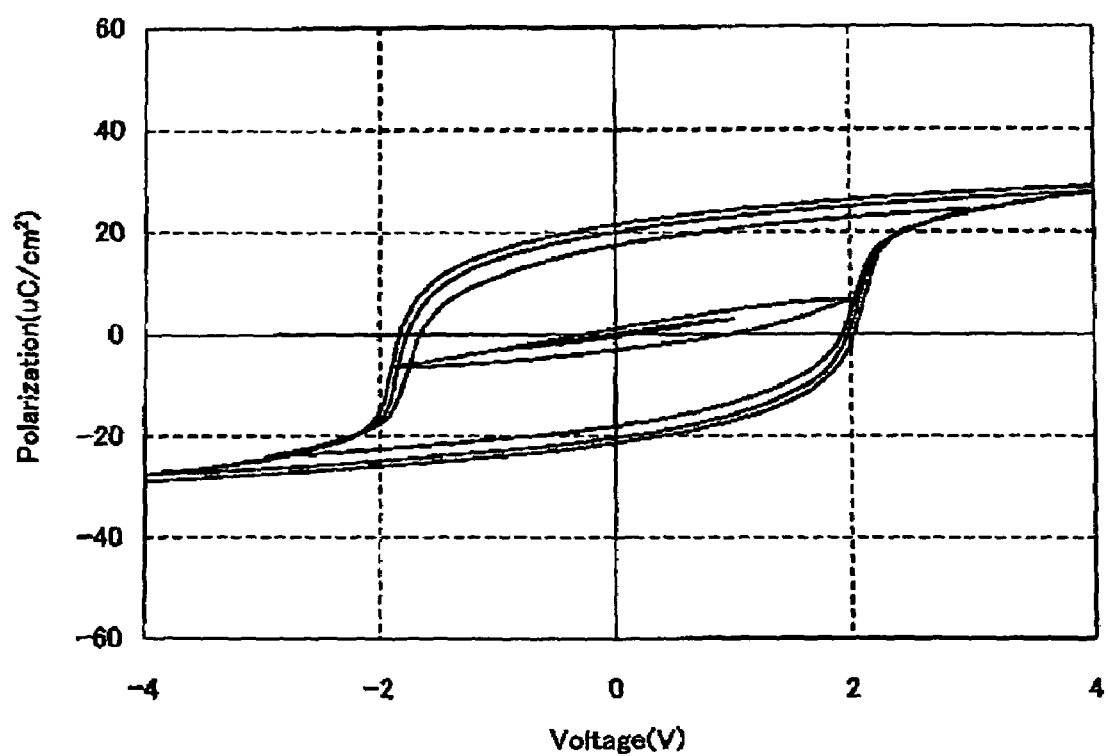
FIG. 5 is a graph showing hysteresis characteristics of a ferroelectric film according to one embodiment of the present invention.

A $PbZr_{0.3}Ti_{0.7}O_3$ (PZT) film with a thickness of 150 nm was formed by using the MOCVD method using the method of forming a ferroelectric film of the present embodiment according to the above-described deposition steps. As a result, the PZT film was confirmed to have excellent surface morphology as shown in FIG. 4 and excellent hysteresis characteristics as shown in FIG. 5. The hysteresis characteristics were measured after forming a Pt upper electrode with a diameter of 100 μm and a thickness of 100 nm on the PZT film.

The method of forming a ferroelectric film of the present embodiment may be applied to a method of manufacturing a ferroelectric memory or a piezoelectric device using the ferroelectric film. An example in which the method of forming a ferroelectric film of the present embodiment is applied to the method of manufacturing a ferroelectric memory is described below.

3. Application to Method of Manufacturing Ferroelectric Memory

Figure 6A:
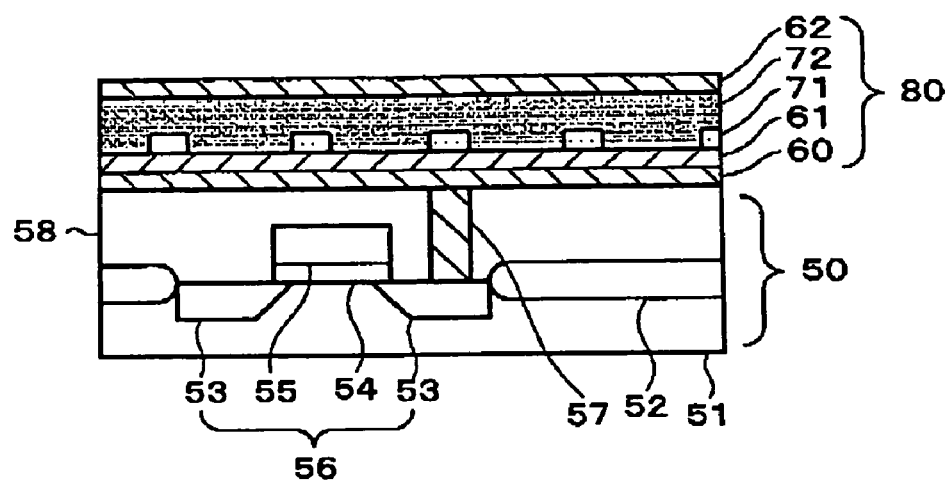
FIGS. 6A to 6C are cross-sectional views showing steps of manufacturing a ferroelectric memory to which the steps in the method of forming a ferroelectric film according to one embodiment of the present invention are applied.
Figure 6B:
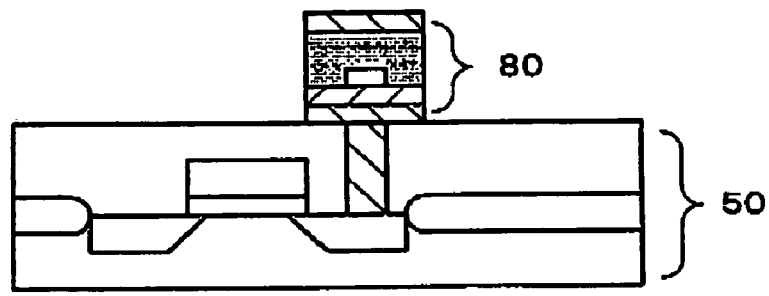
Figure 6C:
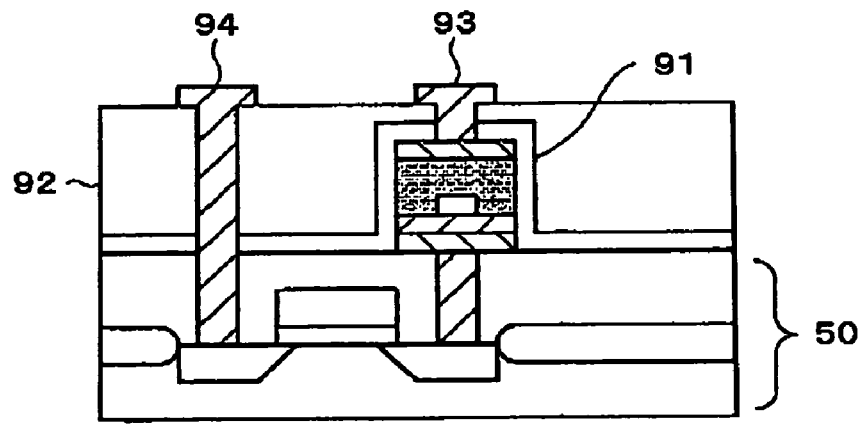

FIGS. 6A to 6C are cross-sectional views schematically showing an example of manufacturing steps of a ferroelectric memory according to this example.

In this example, as shown in FIG. 6A, the PbPt₃ alloy film 61, the PbTiO₃ initial crystal nuclei 71, and the PZT crystal grown layer 72 are formed in that order on the substrate 50, on which the Pt metal film 60 as a lower electrode of a ferroelectric capacitor 80 is formed, by using the above-described method of forming a ferroelectric film. A Pt metal film 62 as an upper electrode of the ferroelectric capacitor 80 is formed on the PZT crystal grown layer 72. As the substrate 50, a semiconductor substrate 51 on which a cell select transistor 56 is formed may be used, as shown in FIG. 6A. The transistor 56 may include a source/drain 53, a gate oxide film 54, and a gate electrode 55. A stack structure may be employed in which a plug electrode 57 is formed of tungsten or the like on one of the source/drains 53 of the transistor 56 so as to be connected with the Pt metal film 60 as the lower electrode of the ferroelectric capacitor 80. In the substrate 50, the transistors 56 are separated in cell units by an element isolation region 52. A first interlayer dielectric 58 may be formed of an oxide film or the like on the transistor 56.

In this example, as shown in FIG. 6B, the ferroelectric capacitor 80 is patterned into a desired size and shape. As shown in FIG. 6C, a hydrogen barrier film 91 is formed to cover the ferroelectric capacitor 80, and a second interlayer dielectric 92 is formed. Metal interconnect layers 93 and 94 for connecting the ferroelectric capacitor 80 and the transistor 56 with the outside through through-holes formed in the second interlayer dielectric 92 are formed to obtain a ferroelectric memory. According to the steps in this example, since a PZT ferroelectric film having an excellent crystal quality is formed, a ferroelectric memory with excellent characteristics can be realized.

This example illustrates the steps of forming a so-called 1T1C type ferroelectric memory. The method of forming a ferroelectric film of the present embodiment may also be applied to steps of manufacturing ferroelectric memories using various cell structures such as 2T2C type and simple matrix type (cross-point type).

The preferred embodiment of the present invention is described above. However, the present invention is not limited to the above-described embodiment. The present invention may be embodied in various modified forms within the scope of the present invention.

What is claimed is:

1. A method of forming a ferroelectric film including a complex oxide of lead zirconate titanate (PZT) family on a metal film formed of platinum (Pt) by using a metalorganic chemical vapor deposition method, the method comprising:

starting supply of lead (Pb) to form an alloy film of Pb and Pt on the metal film, the alloy film being formed in an inert gas atmosphere;

starting supply of titanium (Ti) and an oxidizing gas at the same time to form initial crystal nuclei of a lead titanate (PbTiO₃) on the alloy film; and starting supply of zirconium (Zr) to form a crystal grown layer of the complex oxide of PZT family on the initial crystal nuclei.

2. The method of forming a ferroelectric film as defined in claim 1, the initial crystal nuclei being formed in an island pattern.

3. A method of forming a ferroelectric film including a complex oxide of lead zirconate titanate (PZT) family on a metal film formed of platinum (Pt) by using a metalorganic chemical vapor deposition method, the method comprising:

starting supply of lead (Pb) to form an alloy film of Pb and Pt on the metal film, the alloy film is formed at about 150° C.;

starting supply of titanium (Ti) to form initial crystal nuclei of a lead titanate (PbTiO₃) on the alloy film; and starting supply of zirconium (Zr) to form a crystal grown layer of the complex oxide of PZT family on the initial crystal nuclei.

4. The method of forming a ferroelectric film as defined in claim 3, the initial crystal nuclei being formed in an island pattern.

5. A method of forming a ferroelectric film including a complex oxide of lead zirconate titanate (PZT) family on a metal film formed of platinum (Pt) by using a metalorganic chemical vapor deposition method, the method comprising:

forming an alloy film of Pb and Pt on the metal film, the alloy film being formed in an inert gas atmosphere;

form initial crystal nuclei of a lead titanate (PbTiO₃) on the alloy film in an oxidizing gas atmosphere; and forming a crystal grown layer of the complex oxide of PZT family on the initial crystal nuclei.

6. A method of forming a ferroelectric film including a complex oxide of lead zirconate titanate (PZT) family on a metal film formed of platinum (Pt) by using a metalorganic chemical vapor deposition method, the method comprising:

forming an alloy film of Pb and Pt on the metal film at about 150° C.; forming initial crystal nuclei of a lead titanate (PbTiO₃) on the alloy film; and forming a crystal grown layer of the complex oxide of PZT family on the initial crystal nuclei.

* * * * *